United States Patent
Gupta et al.

(10) Patent No.: US 9,970,273 B2
(45) Date of Patent: May 15, 2018

(54) GROUND FAULT IMMUNE POWER SYSTEM FOR DOWNHOLE SENSORS

(71) Applicant: Halliburton Energy Services, Inc, Houston, TX (US)

(72) Inventors: Sudhir Kumar Gupta, Kingwood, TX (US); Patrick Phang, Houston, TX (US)

(73) Assignee: Halliburton Energy Services, Inc., Houston, TX (US)

( * ) Notice: Subject to any disclaimer, the term of this patent is extended or adjusted under 35 U.S.C. 154(b) by 47 days.

(21) Appl. No.: 15/119,633

(22) PCT Filed: Apr. 29, 2014

(86) PCT No.: PCT/US2014/035905
§ 371 (c)(1),
(2) Date: Aug. 17, 2016

(87) PCT Pub. No.: WO2015/167464
PCT Pub. Date: Nov. 5, 2015

(65) Prior Publication Data
US 2017/0058653 A1    Mar. 2, 2017

(51) Int. Cl.
H02H 3/00    (2006.01)
E21B 43/12    (2006.01)
G01R 31/02    (2006.01)
H02J 3/14    (2006.01)
E21B 47/00    (2012.01)

(52) U.S. Cl.
CPC .......... *E21B 43/128* (2013.01); *G01R 31/025* (2013.01); *H02J 3/14* (2013.01); *E21B 47/00* (2013.01)

(58) Field of Classification Search
USPC .......................................................... 361/47
See application file for complete search history.

(56) References Cited

U.S. PATENT DOCUMENTS

| 5,334,887 A | 8/1994 | Mohan et al. |
| 6,260,615 B1 | 7/2001 | Dairymple et al. |

(Continued)

OTHER PUBLICATIONS

International Search Report and the Written Opinion of the International Search Authority, or the Declaration, dated Sep. 25, 2014, PCT/US2014/035905, 8 pages, ISA/US.

*Primary Examiner* — Ronald W Leja
(74) *Attorney, Agent, or Firm* — Haynes and Boone, LLP

(57) ABSTRACT

A ground fault immune power and data delivery system for downhole sensors is connected to a downhole motor via a three-phase power cable. An AC power supply and sensor data module are connected to only two of the three phases to provide power and data signals to the sensors. During normal operation, power and data signals are transmitted over only one of the two connected phases. If a ground fault is detected on the third unconnected phase, power and data signals continue to transmit over the connected phase. If a ground fault is detected on one of the two connected phases, an isolation module isolates the grounded phase and switches to the ungrounded connected phase to continue transmitting power and data signals. If two of the phases are grounded, the motor shuts off; however, power and data signals may continue to transmit over an ungrounded connected phase.

19 Claims, 3 Drawing Sheets

(56) References Cited

U.S. PATENT DOCUMENTS

2003/0085816 A1     5/2003   Baird et al.
2008/0272932 A1   11/2008   Booker et al.
2010/0194585 A1     8/2010   Skinner et al.
2015/0109139 A1*   4/2015   Shanks .................... H04B 3/54
                                                                      340/854.9

* cited by examiner

GROUND FAULT IMMUNE POWER SYSTEM FOR DOWNHOLE SENSORS

PRIORITY

The present application is a U.S. National Stage patent application of International Patent Application No. PCT/US2014/035905, filed on Apr. 29, 2014, the benefit of which is claimed and the disclosure of which is incorporated herein by reference in its entirety.

FIELD OF THE DISCLOSURE

The present disclosure relates generally to downhole power systems and, more specifically, to a ground fault immune power and data delivery system for downhole sensors.

BACKGROUND

Artificial lift systems, such as Electrical Submersible Pump ("ESP") systems, are often used in hydrocarbon producing wells to pump fluids from the well up to the surface. A conventional ESP system typically includes a centrifugal pump that is driven by a three-phase voltage supply and a variable speed drive, both located at the surface, that deliver the three-phase power to the downhole motor via a three-phase power cable. In addition, data signals between the surface and downhole sensors are also transmitted over the power cable. Such signals include various data related to performance of downhole components and downhole measurements.

An issue arises, however, when one or more of the phases are grounded along the power cable. When this occurs, data transmission is no longer possible over the power cable.

Accordingly, there is a need in the art for a ground fault immune power and data delivery system for use in a downhole environment.

DESCRIPTION OF ILLUSTRATIVE EMBODIMENTS

Figure 1:
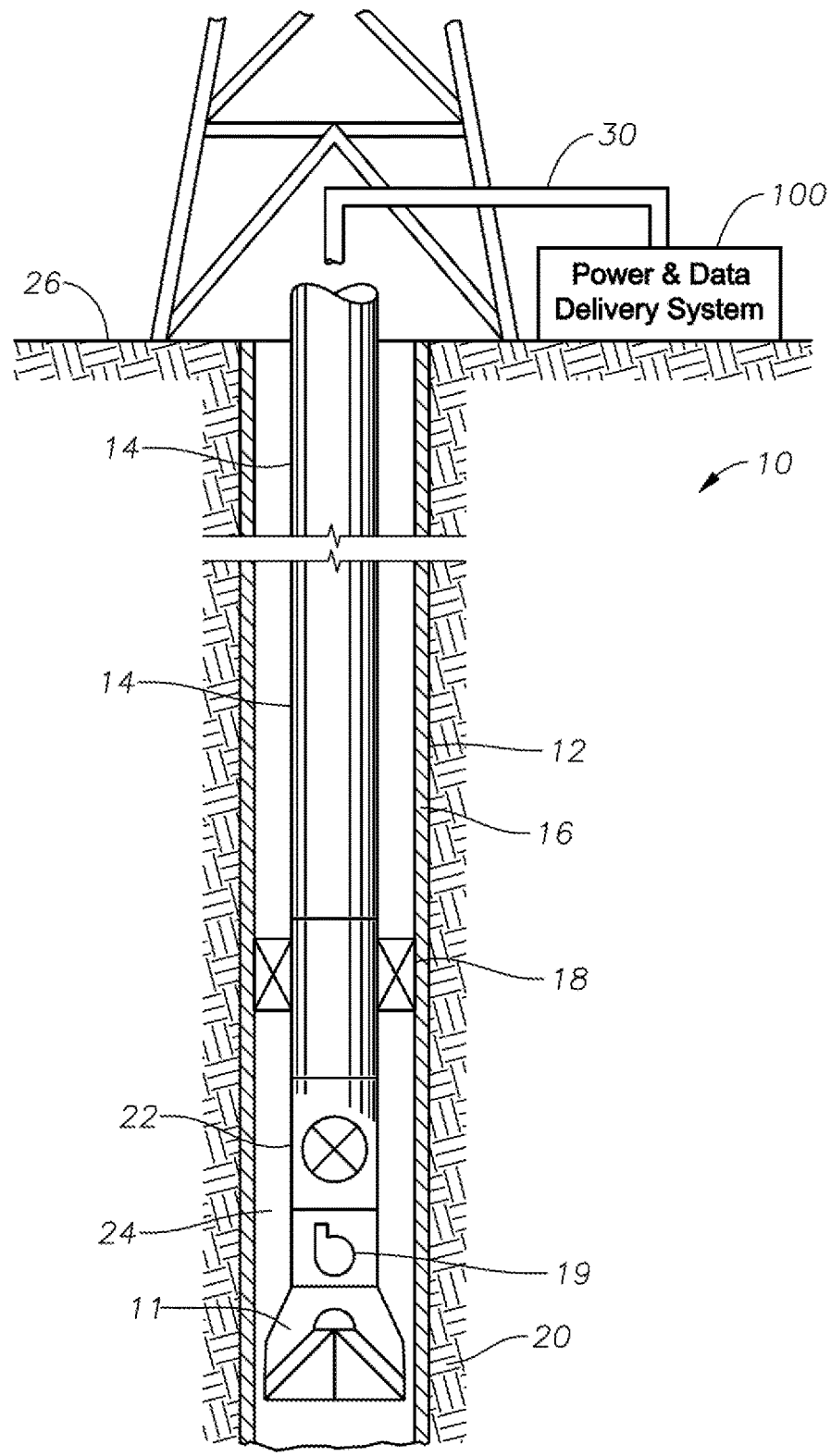
FIG. 1 is a schematic illustration of a well system utilizing a ground fault immune power and data delivery system, according to certain illustrative embodiments of the present disclosure.

Illustrative embodiments and related methods of the present disclosure are described below as they might be employed in a ground fault immune power and data delivery system for downhole sensors. In the interest of clarity, not all features of an actual implementation or method are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure. Further aspects and advantages of the various embodiments and related methodologies of the disclosure will become apparent from consideration of the following description and drawings.

As described herein, illustrative embodiments of the present disclosure provide a ground fault immune power and data delivery system for downhole sensors. In a generalized embodiment, a three-phase power supply at a surface provides three-phase power to a downhole motor (e.g., ESP motor) via a three-conductor cable. A downhole sensor module is connected to the downhole motor via a Wye point connection. An alternating current ("AC") power supply at the surface is connected to only two of the three conductors to thereby supply AC power signals to the downhole sensor module. A sensor data module at the surface is also connected to the same two conductors to communicate data signals to and from the downhole sensor module. Isolation modules are connected between the AC power supply and sensor data module and the two connected conductors to selectively isolate one of the two conductors in response to a ground fault occurring along the isolated conductor.

During normal operation of this generalized embodiment, power and data signals are transmitted over only one of the two connected conductors. Therefore, if a ground fault is detected on the third unconnected conductor, power and data signals continue to transmit over the single conductor that is connected to the power and data delivery system. When a ground fault is detected on one of the two connected conductors, the isolation module isolates the grounded connected conductor and switches to the ungrounded conductor if necessary. As a result, power and data signals continue to be communicated over the only remaining connected conductor.

The embodiments described herein provide no more circuitry than necessary to maintain ground fault immunity and robust data communication. Since most downhole motors shut down when two of the three conductors are grounded, there is no need for the power and data system of the present disclosure to be connected to more than two conductors. However, many prior art systems do connect to all three conductors, thereby adding unnecessarily complicated and costly circuitry to their designs. Embodiments of the present disclosure, however, take advantage of this shut down feature in that only two of the three conductors are connected to the power and data delivery system. Upon the occurrence of a ground fault on any one of the three conductors, the power and data delivery system continues to communicate over one of the two connected conductors. If a ground fault occurs on two of the three conductors, the power and data delivery system will still allow the transmission of power and data signals (assuming the ungrounded conductor is a connected conductor) even though the motor has shut down, which is especially useful during temporary motor shut-down conditions. Accordingly, efficient and robust ground fault immunity and data communication is provided at less cost.

FIG. 1 is a schematic illustration of a well system utilizing a ground fault immune power and data delivery system, according to certain illustrative embodiments of the present disclosure. Well system 10 includes a wellbore 12 extending through various earth strata, including a production zone 20. Wellbore 12 has installed therein casing 16 and a tool string 14, which, in this example, is a production string. A packer assembly 18 is shown positioned above a standing valve assembly 22, sealing annulus 24 formed between production string 14 and wellbore casing 16 and isolating the production interval. A downhole motor 19 (e.g., a downhole submersible pump, such as an ESP or other artificial lift system) is positioned downhole from standing valve assembly 22 for pumping production fluid from the formation to surface 26. As understood in the art, standing valve assembly 22 prevents fluid back-flow into downhole motor 19 when the pump is shut off for maintenance, injection procedures, pressure tests, etc. A drill bit 11 is positioned below downhole motor 19 for penetrating the earth strata.

A ground fault immune power and data delivery system 100 is positioned at surface 26. As will be described in more detail below, power and data delivery system 100 supplies three-phase power to downhole motor 19 via three-phase power cable 30, which is a three conductor cable. Power and data delivery system 100 also supplies AC power via power cable 30 to a downhole sensor module (not shown) that is connected to downhole motor 19. In addition, power and data delivery system 100 also enables data communication between a sensor data module (not shown) and the downhole sensor module via power cable 30.

Although described herein for use in a downhole ESP sensor application, various embodiments of the present disclosure may be utilized in any downhole system that utilizes three-conductor power line carrier communication, such as, for example, some wireline applications, logging-while-drilling ("LWD") applications, measurement-while-drilling ("MWD") applications, slickline applications, etc., as will be understood by those ordinarily skilled in the art having the benefit of this disclosure. Moreover, while shown in FIG. 1 in a cased, vertical wellbore, illustrative embodiments of the present disclosure will work in any orientation, and in open or cased hole. It is understood that embodiments of the disclosure can be used in various methods, including production, work-over, completion, testing, drilling, fracturing, remedial procedures, etc.

Figure 2:
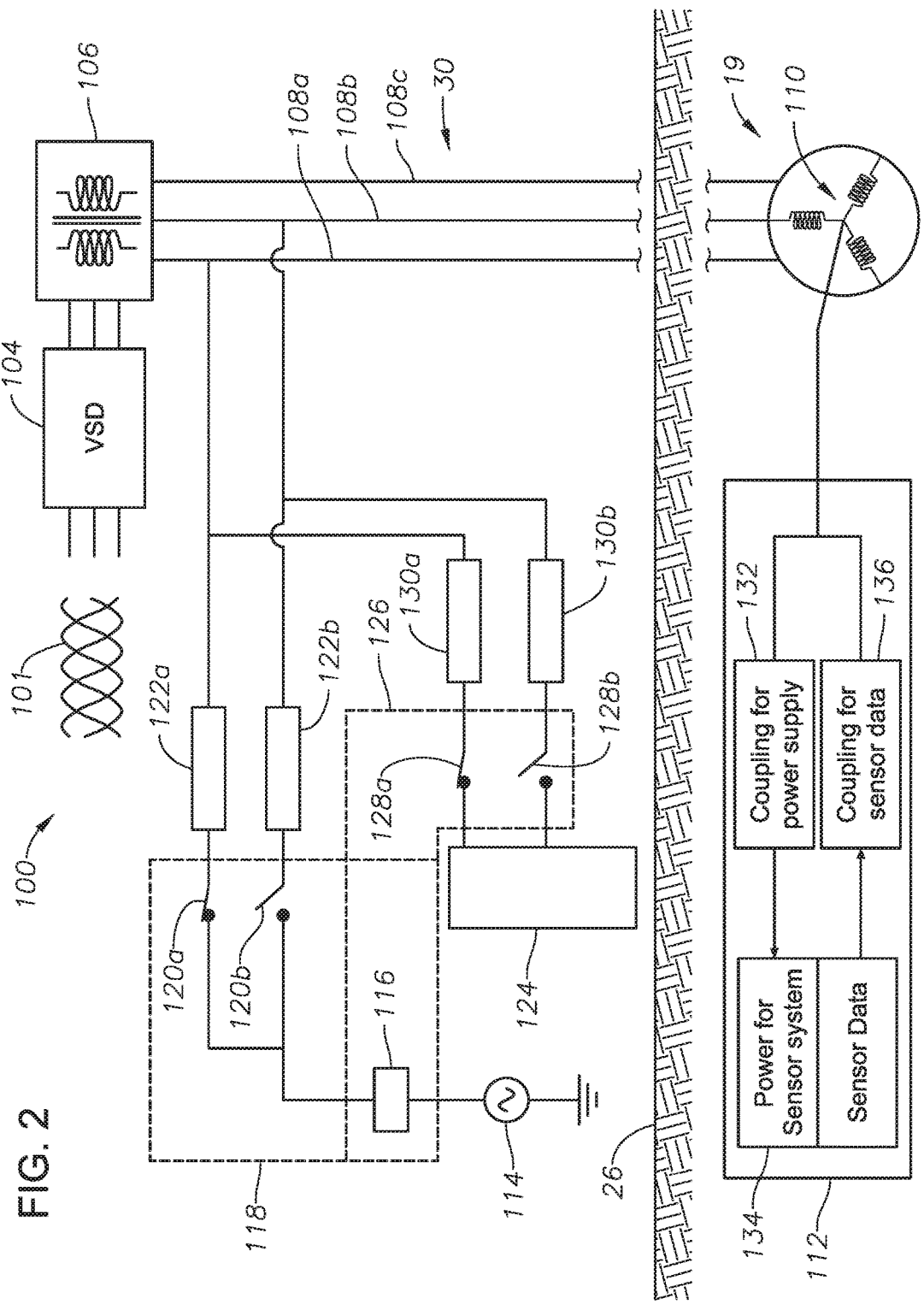
FIGS. 2 and 3 are simplified block diagrammatical illustrations that show the operation and features of alternative illustrative embodiments of a ground fault immune power and data delivery system.

FIG. 2 is a simplified block diagrammatical illustration that shows the operation and is features of an illustrative embodiment of ground fault immune power and data delivery system 100. As previously stated, power and data delivery system 100 provides power and data communication downhole via power cable 30. Power and data delivery system 100 includes a three-phase voltage input 102 which feeds a variable speed drive 104 that controls the speed of downhole motor 19 using a controller (not shown). A step-up transformer 106 is connected between variable speed drive 104 and power cable 30. Power cable 30 may extend thousands of feet into the wellbore where it is ultimately connected to downhole motor 19. By altering the output voltage and frequency of variable speed drive 104, the controller associated therewith controls the speed of downhole motor 19.

Power cable 30 includes a first conductor 108a, second conductor 108b and third conductor 108c which jointly provide the three phases of power to downhole motor 19. Downhole motor 19 is connected to conductors 108a,b,c via a Wye point connection 110. A downhole sensor module 112 is connected to Wye point 110 whereby power and data signals are communicated over power cable 30 as will be described below. Sensor module 112 may utilize a variety of sensors, including, for example, resistivity, magnetic or electrical sensors.

At surface 26, power and data delivery system 100 further includes a variable (volts and frequency) AC power supply 114 to provide AC power signals to downhole sensor module 112. In this illustrative embodiment, AC power supply 114 is only connected to first conductor 108a and second conductor 108b to thereby supply the AC power signals. A first isolation module 118 is connected to AC power supply 114 to selectively isolate the first or second conductor 108a,b in response to a ground fault occurring along the isolated conductor 108a or 108b. As a result, the AC power signals continue to be supplied over the single connected conductor 108a or 108b.

First isolation module 118 includes a current sensor 116 connected in series to AC power supply 114 to thereby detect the current being supplied from AC power supply 114. The detected current level is an indicator of whether there is a ground in one of the conductors 108a,b. A first switch 120a and second switch 120b are connected to current sensor 116 in order to affect the isolation of first or second conductors 108a,b. Although not shown, processing circuitry (e.g., microprocessor) is coupled to current sensor 116 and switches 120a,b to control the isolation. The processing circuitry may be some standalone circuitry or may the same controller used to is control variable speed drive 104 and other system components. Current sensor 116, first switch 120a and second switch 120b, along with the processing circuitry all form part of the first isolation module 118.

It should also be noted that the processing circuitry may include at least one processor, or analog circuit which triggers based on a current threshold, and a non-transitory and computer-readable storage, all interconnected via a system bus. Software instructions executable by the processor for implementing the illustrative power and data communication methods described herein in may be stored in local storage or some other computer-readable medium. It will also be recognized that the same software instructions may also be loaded into the storage from a CD-ROM or other appropriate storage media via wired or wireless methods.

Moreover, those ordinarily skilled in the art will appreciate that various aspects of the disclosure may be practiced with a variety of computer-system configurations, including hand-held devices, multiprocessor systems, microprocessor-based or programmable-consumer electronics, minicomputers, mainframe computers, and the like. Any number of computer-systems and computer networks are acceptable for use with the present disclosure. The disclosure may be practiced in distributed-computing environments where tasks are performed by remote-processing devices that are linked through a communications network. In a distributed-computing environment, program modules may be located in both local and remote computer-storage media including memory storage devices. The present disclosure may therefore, be implemented in connection with various hardware, software or a combination thereof in a computer system or other processing system.

Referring back to FIG. 1, to control the isolation technique during operation, first isolation module 118 detects a ground fault along first conductor 108a or second conductor 108b. Such fault detection may be accomplished in a variety of ways. In a first illustrative embodiment, the processing circuitry determines the current at first switch 120a and second switch 120b by reading the current level detected by sensor 116 and then comparing the reading to current levels at switches 120a,b. For example, the reading of current levels at switches 120a,b may be accomplished by closing switch 120a at a time A, detecting the current, and then storing the reading. At time B, switch 120a is opened, switch 120b is closed, the current is detected, and then stored. The processing circuitry thereafter compares the two currents to determine which switch 120a,b needs to be opened. When one of first or second conductors 108a,b are grounded, the current on the grounded conductor increases. As the processing circuitry continuously monitors the current at the first and second switches 108*a,b*, the resulting higher current reading prompts the processing circuitry to open the corresponding switch 120*a* or 120*b*. Once opened, the other switch 120*a* or 120*b* is closed, thereby maintaining the supply of the AC power signal to downhole sensor module 112 via the connected conductor 108*a* or 108*b*. In FIG. 2, first conductor 108*a* is the connected conductor, while second conductor 108*b* is the isolated conductor.

In an alternative method to detect a ground fault, the processing circuitry may monitor the currents at first and second switch 120*a,b* continuously and compare the current readings to a preset threshold current value. In certain illustrative embodiments, the threshold value could be precomputed by the processing circuitry based on voltage of AC power supply 114 and the impedance of the overall circuit connected thereto. Once either current is determined to exceed the preset value, the corresponding switch 120*a,b* is opened, while the other switch 120*a,b* is closed.

Still referring to FIG. 2, ground fault immune power and data delivery system 100 further includes a first tuned impedance coupling 122*a* connected between first switch 120*a* and first conductor 108*a*. A second tuned impedance coupling 122*b* is connected between second switch 120*b* and second conductor 108*b*. As will be understood by those ordinarily skilled in the at having the benefit of this disclosure, the first and second tuned impedance couplings allow the frequencies of AC power supply 114 to pass onto to first and second conductors 108*a,b*, while presenting high impedance to other frequencies, thereby preventing low frequency motor voltages supplied by VSD 104 and transformer 106 from entering data/sensor power supply circuitry. Such couplings may be designed in a variety of ways including, for example, a capacitor in series with an inductor or other necessary design.

Ground fault immune power and data delivery system 100 further includes a sensor data module 124 which controls data communications (one-way and bi-directional communication) with downhole sensor module 112 via first and second conductors 108*a,b*. Among other functions, sensor data module 124 primarily demodulates data signals received from downhole sensor circuitry. A second isolation module 126 is connected to sensor data module 124 to selectively isolate one of the first or second conductors 108*a,b* in response to the detected ground fault. Although not shown, the processing circuitry coupled to first isolation module 118 is also coupled to second isolation module 126 to control third and fourth switches 128*a* and 128*b*. Current sensor 116, third switch 128*a*, fourth switch 128*b* and the processing circuitry form second isolation module 126. Third and fourth switches 128*a,b* operate based on currents in first and second switches 120*a,b*, which are detected as previously discussed. Thus, for example, if a ground is detected in conductor 108*a*, switch 120*a* and 128*a* will open in tandem, and switches 120*b* and 128*b* will close in tandem. Accordingly, data signals may be communicated through one of conductors 108*a* or 108*b* in the event of a ground fault.

A third tune impedance coupling 130*a* is connected between third switch 128*a* and first conductor 108*a*. A fourth tuned impedance coupling 130*b* is connected between fourth switch 128*b* and second conductor 108*b*. Third and fourth tuned impedance couplings 130*a,b* are designed to allow the frequencies of data signals sent by sensor data module 124 and downhole sensor module 112 to pass therethrough, while presenting high impedance to other frequencies to prevent failure of data circuitry from high voltages from VSD 104 and transformer 106. It also provides high impedance to the sensor power supply frequency, thus reducing attenuation of the power supply signal. Such couplings may be designed in a variety of ways as previously described.

With reference to FIG. 2, operation of ground fault immune power and data delivery system 100 will now be described. During normal operation, AC power and data signals are transmitted on only one of the conductors 108*a* or 108*b*. In certain embodiments during normal operation, the processing circuitry initially may randomly choose to isolate the first conductor 108*a* or 108*b*, while in other embodiments the conductor having the lowest current is selected. Nevertheless, as a result, only one phase is connected to AC power supply 114 and sensor data module 124 during normal operation. If a ground fault is present on third conductor 108*c*, the AC power and data signals continued to transmit over the connected conductor 108*a,b*. If a ground fault is detected on the first or second conductor 108*a,b*, however, the current on the grounded detector will spike. The processing circuitry coupled to the first and second isolation modules 118,126 detects the current spike at switches 120*a* or 120*b*, and isolates the grounded conductor 108*a* or 108*b* accordingly using one of the detection techniques described above.

During a grounded fault state, some attenuation is still seen on the power and data signals. This is because, even with a ground on 108*c*, for example, there is a path from 108*a* or 108*b* to the ground on 108*c* thru either transformer 106 or motor 19. Thus, in certain illustrative embodiments, the frequencies of power and data signals are chosen in such a way that the impedance of transformer 106 and motor 19 is higher as to these frequencies.

During the grounded fault state, the conductor 108*a* or 108*b* that remains connected to AC power supply 114 and sensor data module 112 continues to communicate AC power and data signals along the connected conductor 108*a* or 108*b*. In the example shown in FIG. 2, second conductor 108*b* is the grounded conductor. As a result, the processing circuitry has isolated second conductor 108*b* by opening switches 120*b* and 128*b*, while switches 120*a* and 128*a* are closed to enable communication along first conductor 108*a*. As such, AC power and data signals are allowed to travel along first conductor 108*a*, through Wye coupling 110 and on to downhole sensor module 112. Here, the AC power and data signals encounter a power coupling which filters out low frequency power from downhole motor 19 caused by the grounding of second conductor 108*b*. The AC power and data signals continue onto to power conversion for sensors and measurement transducers 134 and/or to alter its operation in some way via the data signals. Although not shown, sensors and measurement transducers 134 house a power conversion unit which converts the AC power to the required voltage levels for the downhole processing circuitry. Additionally, sensors and measurement transducers 134 also house transducers to measure well characteristics. Ultimately, data signals (e.g., measurement data) are transmitted from sensors 134 via a coupling 136, back through Wye point 110 and up first conductor 108*a* and to sensor data module 124 for further processing.

As previously mentioned, tuned impedance couplings 122*a,b* are designed to prevent the data signals (based upon frequency, for example) from passing to current sensor 116 and AC power supply. Tuned impedance couplings 122*a,b* also prevent the high voltage feeding ESP motor from entering current sensor 116 and AC power supply 114, while tuned impedance couplings 130*a,b* are designed such that the data signals are allowed to pass onto sensor data module 124. At the same time, however, tuned impedance couplings 130a,b also prevent AC power signals and high voltages feeding motor 19 from propagating back to sensor data module 124, as will be understood by those ordinarily skilled in the art having the benefit of this disclosure.

During the grounded state, three-phase power continues to be supplied to downhole motor 19 via cable 30 to thereby power motor 19. If, however, two of the three conductors 108a,b,c, are grounded somehow, downhole motor 19 shuts down. Nevertheless, AC power and data signals continue to transmit as long as the ungrounded conductor is 108a or 108b. If, however, conductors 108a,b are the grounded conductors, communication of AC power and data signals through Wye point 110 is prevented. Therefore, embodiments of the present disclosure take advantage of this shut down feature in the design of downhole motor to simplify the circuitry of system 100 whereby only first and second conductors 108a,b may communicate AC power and data signals. As a result, a more cost-effective power and data delivery system is provided because less power and signaling components are necessary.

When conductors 108a and 108b are grounded, the processing circuitry will open switches 120a,b and 130a,b to prevent any destruction of the AC power supply and data communication circuitry. In certain embodiments, however, it may take some time for motor 19 to shut down when two conductors are grounded. In such instances, during the transient time before motor 19 shuts down, the processing circuitry will open all switches.

Figure 3:
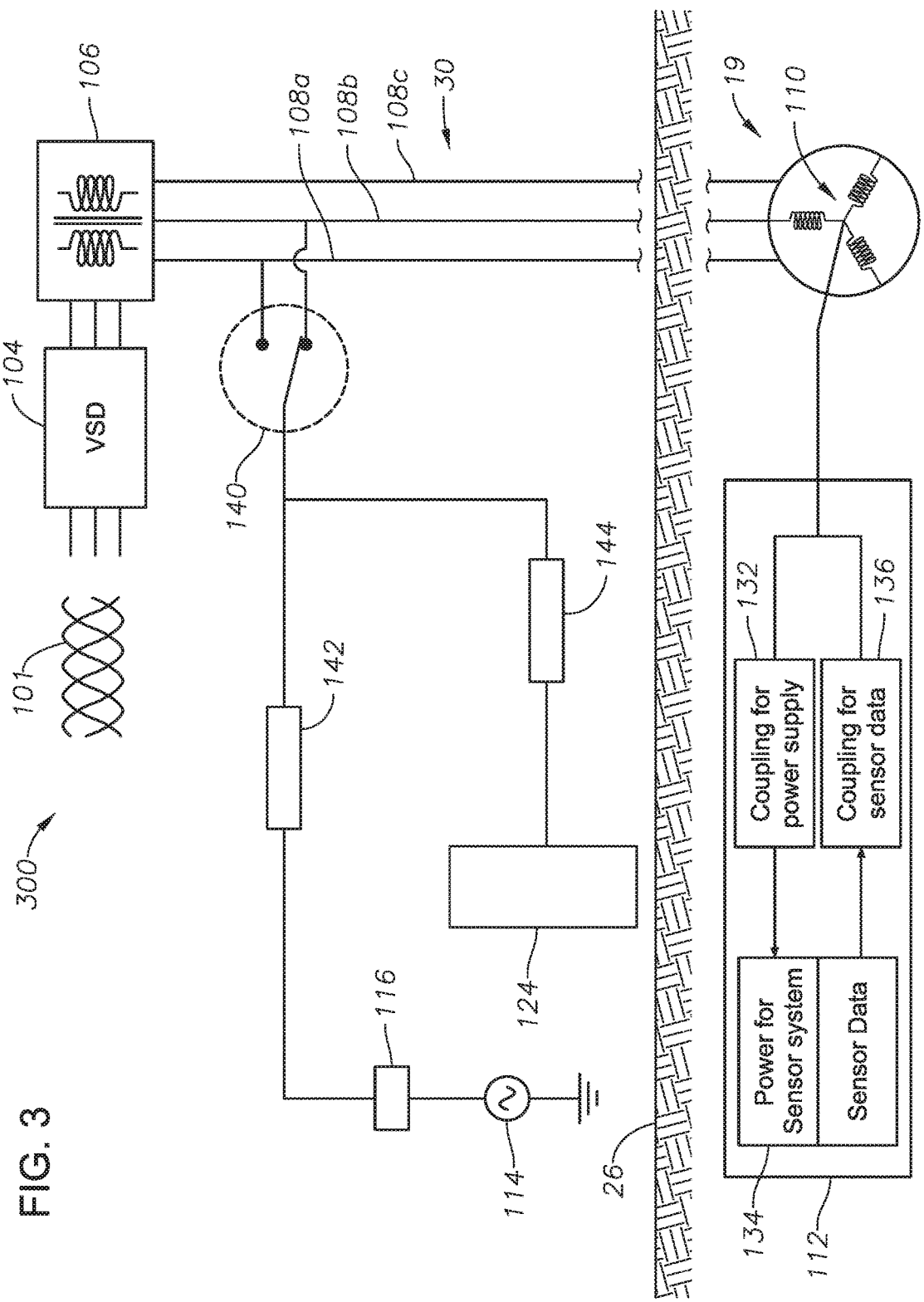

FIG. 3 is a simplified block diagrammatical illustration that shows the operation and features of an alternative illustrative embodiment of ground fault immune power and data delivery system 300. Power and data delivery system 300 is somewhat similar to system 100 described with reference to FIG. 2 and, therefore, may be best understood with reference thereto, where like numerals indicate like elements. In contrast to system 100, however, power and data delivery system 300 only utilizes a first isolation module that includes current sensor 116, a high voltage switch 140, and processing circuitry (not shown) coupled thereto to effect switching of switch 140 between first and second conductor 108a and 108b. A first tuned impedance coupling 142 is connected between current sensor 116 and high voltage switch 140 to filter unwanted signals as previously described. A second tuned impedance coupling 144 is positioned between sensor data module 124 and high voltage switch 140 to also filter unwanted signals as previously described. High voltage switch 140 may be, for example, a high voltage relay or contactor.

As with other embodiments described herein, the processing circuitry may detect ground faults on first and second conductors 108a,b in a variety of ways. In certain illustrative embodiments, for example, the processing circuitry performs the detection and switching based upon a comparison of currents on the first and second conductors 108a,b. In other embodiments, the processing circuitry may determine which conductor to switch to based upon a comparison of the currents on conductors 108a,b to a preset current value. As in other embodiments, the processing circuitry detects the current based upon a reading of current sensor 116. High voltage switch 140 is actuated to connect to both conductors 108a,b in a sequence. Both currents are recorded and then compared, as previously described.

During normal operation of power and data delivery system 300, only one of the conductors 108a or 108b are used to communicate the AC power and data signals. In FIG. 3, second conductor 108b is being used. Initially, before a ground fault is detected, the processing circuitry may randomly choose a conductor 108a or 108b in which to communicate the power and data signals; alternatively, the conductor with the lowest current level may be utilized. Nevertheless, once a ground fault is detected (in this example, a fault has been detected on first conductor 108a), the processing circuitry sends a signal to switch 140 to switch to second conductor 108b, as shown. Thereafter, the AC power and data signals are communicated over second conductor 108b as previously described. Simultaneously, three-phase power continues to be supplied via power cable 30 to downhole motor 19. In the event that a ground fault occurs on two of the three conductors 108a,b,c, downhole motor 19 shuts down.

Utilizing the power and data delivery systems of the present disclosure provides a number of advantages. First, a power supply is provided that is operational even when one of the phases of a downhole motor is grounded. Second, AC power and data components are only connected to two phases, less power and signaling components are needed when compared to conventional designs.

Embodiments described herein further relate to any one or more of the following paragraphs:

1. A ground fault immune power and data delivery system for downhole sensors, comprising a three-phase power supply connected to a power cable to thereby supply power to a downhole motor positioned along a wellbore, the power cable comprising a first, second and is third conductor over which power and data signals are transmitted; a downhole sensor module connected to the downhole motor; an alternating current ("AC") power supply connected to only the first and second conductors to thereby supply power signals to the downhole sensor module; and a first isolation module connected to the AC power supply to thereby selectively isolate one of the first or second conductors in response to a ground fault occurring along the first or second conductor, thereby allowing the power signals to be transmitted over only one of the first or second conductors.

2. A ground fault immune power and data delivery system as defined in paragraph 1, wherein the first isolation module comprises a current sensor to detect current being supplied from the AC power supply; a first switch connected to the first conductor; a second switch connected to the second conductor; and processing circuitry to detect the ground fault based upon: a comparison of current at the first and second switches; or a comparison of the current with a preset current value.

3. A ground fault immune power and data delivery system as defined in paragraphs 1 or 2, further comprising a first tuned impedance coupling connected between the first switch and the first conductor; and a second tuned impedance coupling connected between the second switch and the second conductor.

4. A ground fault immune power and data delivery system as defined in any of paragraphs 1-3, further comprising a sensor data module connected to the first and second conductors to thereby bi-directionally communicate data signals with the downhole sensor module over the first or second conductor; and a second isolation module connected to the sensor data module to thereby selectively isolate one of the first or second conductors in response to the ground fault, thus allowing the data signals to be communicated over only one of the first or second conductors.

5. A ground fault immune power and data delivery system as defined in any of paragraphs 1-4, wherein the second isolation module comprises the current sensor; a third switch connected to the first conductor; a fourth switch connected to the second conductor; and the processing circuitry.

6. A ground fault immune power and data delivery system as defined in any of is paragraphs 1-5, further comprising a third tuned impedance coupling connected between the third switch and the first conductor; and a fourth tuned impedance coupling connected between the fourth switch and the second conductor.

7. A ground fault immune power and data delivery system as defined in any of paragraphs 1-6, wherein the first isolation module comprises a current sensor to detect current being supplied from the AC power supply; a high voltage switch operably to switch between the first and second conductors; and processing circuitry to detect the ground fault based upon: a comparison of current at the first and second conductors; or a comparison of current with a preset current value.

8. A ground fault immune power and data delivery system as defined in any of paragraphs 1-7, further comprising a first tuned impedance coupling connected between the current sensor and the high voltage switch.

9. A ground fault immune power and data delivery system as defined in any of paragraphs 1-8, further comprising a sensor data module connected to the high voltage switch to thereby bi-directionally communicate data signals with the downhole sensor module over the first or second conductor.

10. A ground fault immune power and data delivery system as defined in any of paragraphs 1-9, further comprising a second tuned impedance coupling connected between the sensor data module and the high voltage switch.

11. A ground fault immune power and data delivery system as defined in any of paragraphs 1-10, wherein the downhole motor is an electrical submersible pump.

12. A method for powering downhole sensors, comprising supplying three-phase power to a downhole motor positioned along a wellbore using a power cable comprising a first, second and third conductor; transmitting alternating current ("AC") power signals to a downhole sensor module over only the first or second conductors; detecting a ground fault on the first or second conductor; selectively isolating the first or second conductor based upon the detected ground fault, thus resulting in an isolated conductor and a connected conductor; and transmitting the AC power signals over only the connected conductor.

13. A method as defined in paragraph 12, wherein selectively isolating the first or second conductor comprises detecting current supplied to the first conductor; detecting current supplied to the second conductor; comparing the detected currents of the first and second conductors; and isolating the first or second conductor based upon the comparison.

14. A method as defined in paragraphs 12 or 13, wherein selectively isolating the first or second conductor comprises detecting current supplied to the first conductor; detecting current supplied to the second conductor; comparing the detected currents with a present current value; and isolating the first or second conductor based upon the comparison.

15. A method as defined in any of paragraphs 12-14, wherein isolating the first or second conductor comprises opening a switch connected to a source of the AC power signals.

16. A method as defined in any of paragraphs 12-15, further comprising transmitting data signals over only the connected conductor.

17. A method as defined in any of paragraphs 12-16, wherein isolating the first and second conductor comprises opening a switch connected to a sensor data module.

18. A method as defined in any of paragraphs 12-17, wherein isolating the first or second conductor comprises opening a high voltage switch connected to a source of the AC power signals and a sensor data module.

Moreover, any of the methodologies described herein may be embodied within a system comprising processing circuitry to implement any of the methods, or a in a computer-program product comprising instructions which, when executed by at least one processor, causes the processor to perform any of the methods described herein.

The foregoing disclosure may repeat reference numerals and/or letters in the various examples. This repetition is for the purpose of simplicity and clarity and does not in itself dictate a relationship between the various embodiments and/or configurations discussed. Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the apparatus in use or operation in addition to the orientation depicted in the figures. For example, if the apparatus in the figures is turned over, elements described as being "below" or "beneath" other elements or features would then be oriented "above" the other elements or features. Thus, the term "below" can encompass both an orientation of above and below. The apparatus may be otherwise oriented (rotated 90 degrees or at other orientations) and the spatially relative descriptors used herein may likewise be interpreted accordingly.

Although various embodiments and methodologies have been shown and described, the disclosure is not limited to such embodiments and methodologies and will be understood to include all modifications and variations as would be apparent to one skilled in the art. Therefore, it should be understood that the disclosure is not intended to be limited to the particular forms disclosed. Rather, the intention is to cover all modifications, equivalents and alternatives falling within the spirit and scope of the disclosure as defined by the appended claims.

What is claimed is:

1. A ground fault immune power and data delivery system for downhole sensors, comprising:
    a three-phase power supply connected to a power cable to thereby supply power to a downhole motor positioned along a wellbore, the power cable comprising a first, second and third conductor over which power and data signals are transmitted;
    a downhole sensor module connected to the downhole motor;
    an alternating current ("AC") power supply connected to only the first and second conductors to thereby supply power signals to the downhole sensor module; and
    a first isolation module connected to the AC power supply to thereby selectively isolate one of the first or second conductors in response to a ground fault occurring along the first or second conductor, thereby allowing the power signals to be transmitted over only one of the first or second conductors.

2. A ground fault immune power and data delivery system as defined in claim 1, wherein the first isolation module comprises:
    a current sensor to detect current being supplied from the AC power supply;
    a first switch connected to the first conductor;
    a second switch connected to the second conductor; and
    processing circuitry to detect the ground fault based upon:
        a comparison of current at the first and second switches; or
        a comparison of the current with a preset current value.

3. A ground fault immune power and data delivery system as defined in claim 2, further comprising:
 a first tuned impedance coupling connected between the first switch and the first conductor; and
 a second tuned impedance coupling connected between the second switch and the second conductor.

4. A ground fault immune power and data delivery system as defined in claim 3, further comprising:
 a sensor data module connected to the first and second conductors to thereby bi-directionally communicate data signals with the downhole sensor module over the first or second conductor; and
 a second isolation module connected to the sensor data module to thereby selectively isolate one of the first or second conductors in response to the ground fault, thus allowing the data signals to be communicated over only one of the first or second conductors.

5. A ground fault immune power and data delivery system as defined in claim 4, wherein the second isolation module comprises:
 the current sensor;
 a third switch connected to the first conductor;
 a fourth switch connected to the second conductor; and
 the processing circuitry.

6. A ground fault immune power and data delivery system as defined in claim 5, further comprising:
 a third tuned impedance coupling connected between the third switch and the first conductor; and
 a fourth tuned impedance coupling connected between the fourth switch and the second conductor.

7. A ground fault immune power and data delivery system as defined in claim 1, wherein the first isolation module comprises:
 a current sensor to detect current being supplied from the AC power supply;
 a high voltage switch operably to switch between the first and second conductors; and
 processing circuitry to detect the ground fault based upon:
  a comparison of current at the first and second conductors; or
  a comparison of current with a preset current value.

8. A ground fault immune power and data delivery system as defined in claim 7, further comprising a first tuned impedance coupling connected between the current sensor and the high voltage switch.

9. A ground fault immune power and data delivery system as defined in claim 8, further comprising a sensor data module connected to the high voltage switch to thereby bi-directionally communicate data signals with the downhole sensor module over the first or second conductor.

10. A ground fault immune power and data delivery system as defined in claim 9, further comprising a second tuned impedance coupling connected between the sensor data module and the high voltage switch.

11. A ground fault immune power and data delivery system as defined in claim 1, wherein the downhole motor is an electrical submersible pump.

12. A method for powering downhole sensors, comprising:
 supplying three-phase power to a downhole motor positioned along a wellbore using a power cable comprising a first, second and third conductor;
 transmitting alternating current ("AC") power signals to a downhole sensor module over only the first or second conductors;
 detecting a ground fault on the first or second conductor;
 selectively isolating the first or second conductor based upon the detected ground fault, thus resulting in an isolated conductor and a connected conductor; and
 transmitting the AC power signals over only the connected conductor.

13. A method as defined in claim 12, wherein selectively isolating the first or second conductor comprises:
 detecting current supplied to the first conductor;
 detecting current supplied to the second conductor;
 comparing the detected currents of the first and second conductors; and
 isolating the first or second conductor based upon the comparison.

14. A method as defined in claim 12, wherein selectively isolating the first or second conductor comprises:
 detecting current supplied to the first conductor;
 detecting current supplied to the second conductor;
 comparing the detected currents with a present current value; and
 isolating the first or second conductor based upon the comparison.

15. A method as defined in claim 13, wherein isolating the first or second conductor comprises opening a switch connected to a source of the AC power signals.

16. A method as defined in claim 13, further comprising transmitting data signals over only the connected conductor.

17. A method as defined in claim 15, wherein isolating the first and second conductor comprises opening a switch connected to a sensor data module.

18. A method as defined in claim 15, wherein isolating the first or second conductor comprises opening a high voltage switch connected to a source of the AC power signals and a sensor data module.

19. A ground fault immune power and data delivery system comprising processing circuitry to perform the method of claim 12.

* * * * *